(12) United States Patent
Davydov et al.

(10) Patent No.: US 12,328,849 B2
(45) Date of Patent: Jun. 10, 2025

(54) SPACE SAVING DATA CENTER SYSTEM

(71) Applicants: Rodion Davydov, Miami, FL (US); Alexander Sinelnikov, Edison, NJ (US)

(72) Inventors: Rodion Davydov, Miami, FL (US); Alexander Sinelnikov, Edison, NJ (US)

(73) Assignee: Boot Hardware LLC, Miami, FL (US)

( * ) Notice: Subject to any disclaimer, the term of this patent is extended or adjusted under 35 U.S.C. 154(b) by 0 days.

(21) Appl. No.: 18/332,807

(22) Filed: Jun. 12, 2023

(65) Prior Publication Data
US 2024/0414889 A1    Dec. 12, 2024

(51) Int. Cl.
*H05K 7/20*    (2006.01)
*H05K 7/14*    (2006.01)

(52) U.S. Cl.
CPC ....... *H05K 7/20736* (2013.01); *H05K 7/1489* (2013.01); *H05K 7/20909* (2013.01)

(58) Field of Classification Search
None
See application file for complete search history.

(56) References Cited

U.S. PATENT DOCUMENTS

| | | | |
|---|---|---|---|
| 6,496,366 B1* | 12/2002 | Coglitore | G06F 1/20 361/679.48 |
| 2008/0123292 A1* | 5/2008 | Wobig | G06F 1/20 361/695 |
| 2015/0098173 A1* | 4/2015 | Leigh | H05K 7/20727 361/679.5 |
| 2019/0327001 A1* | 10/2019 | White, Jr. | H05K 7/1452 |

* cited by examiner

*Primary Examiner* — Mukundbhai G Patel
(74) *Attorney, Agent, or Firm* — Joel Douglas

(57) ABSTRACT

A data center server system including a data server frame and a plurality of server cases mountable to the data server frame and having a front panel and a rear panel, an air shroud extending from the front panel to the rear panel, a high temperature zone disposed on a first side of the air shroud, a low temperature zone disposed on an opposite side of the air shroud and at least one fan disposed in each of the plurality of server case for providing air flow. The plurality of server cases are positioned back to back with an adjacent server case whereby the air flow is maintained from the high temperature zone of one server case to the low temperature zone of the adjacent server case and from the low temperature zone of the one server cases to the high temperature zone of the adjacent server case.

20 Claims, 4 Drawing Sheets

SPACE SAVING DATA CENTER SYSTEM

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

Trademarks used in the disclosure of the invention, and the applicants, make no claim to any trademarks referenced.

BACKGROUND OF THE INVENTION

Field of the Invention

The invention relates to data center server hardware and more particularly to a data center server system which allows for placement of back to back servers.

Description of Related Art

Currently the state of the art includes servers which are slidably secured to a rack, the rack accessible only on one side.

A high-density server is a server that contains a large number of CPUs, each of which may be hot swapped in and out on its own printed circuit board. What is needed is a server storage rack system which increases server density in a data center.

SUMMARY OF THE INVENTION

Bearing in mind the problems and deficiencies of the prior art, it is therefore an object of the present invention to provide a data center server system which allows servers to be placed back to back in a server rack and allow for proper heat dissipation and removal from the servers.

A further object of the invention is to provide a kit for the data center server system, the system allowing for back to back server placement within the server rack.

Still other objects and advantages of the invention will in part be obvious and will in part be apparent from the specification.

The above and other objects, which will be apparent to those skilled in the art, are achieved in the present invention which is directed to a data center server system including a data server frame having two front vertical frame members and two rear vertical frame members, a front frame opening extending between the two front vertical frame members, a rear frame opening extending between the two rear vertical frame members and a frame central plane parallel to the front frame opening and the rear frame opening and extending substantially equally between the front frame opening and the rear frame opening. The front frame opening and the rear frame opening are substantially rectangular. The data center server system includes a plurality of server cases mountable to the data server frame each server case having a front panel and a rear panel, an air shroud extending from the front panel to the rear panel, a high temperature zone disposed on a first side of the air shroud, a low temperature zone disposed on an opposite side of the air shroud and at least one fan disposed in each of the plurality of server cases, the at least one fan for providing air flow. The data center server system includes a plurality of sliding support rails extending between the two front vertical frame members and the two rear vertical frame members, the plurality of sliding support rails for slidingly securing the plurality of server cases to the data server frame. The at least one of the plurality of server cases is positioned back to back with an adjacent server case whereby the air flow is maintained by the at least one fan in the at least one of the plurality of server cases from the low temperature zone of the at least one of the plurality of server cases to the high temperature zone of the adjacent server case or from the high temperature zone of the at least one of the plurality of server cases to the low temperature zone of the adjacent server case. The data center server system may have additional air flow provided by the at least one fan in the adjacent server case from the low temperature zone of the adjacent server case to the high temperature zone of the at least one of the plurality of server cases or from the high temperature zone of the adjacent server case to the low temperature zone of the at least one of the plurality of server cases. The data center server system may include high-density servers having a plurality of CPUs, each of which may be hot swapped in and out on its own printed circuit board. Each server case may include a power supply air shroud for providing a third temperature or for isolating a power supply from the high temperature zone and the low temperature zone or for providing additional cooling for the high temperature zone. The shroud may be positioned to prevent heat sensitive server components from receiving hot air from an adjacent server case. The server cases may be compatible with full ATX motherboards or with micro ATX motherboards. Each of the plurality of server cases may be slidable from an installed position wherein the rear panel is adjacent the frame central plane to a servicing position wherein the rear panel is positioned away from the frame central plane. The data server frame may have a cuboid frame, the cuboid frame having a pair of front vertical frame supports and a pair of rear vertical frame supports, at least one left support rail extending between one of the pair of front vertical frame supports and one of the pair of rear vertical frame supports, at least one right support rail extending between an other of the pair of front vertical frame supports and the other of the pair of rear vertical frame supports and at least one first server case having a first server front panel and a first server rear panel, the at least one first server case secured to an internal portion of the at least one right support rail and the at least one left support rail.

Another aspect of the present invention is directed to a data center server kit including a data server frame including a pair of front vertical frame supports, a pair of rear vertical frame supports and a plurality of support rails extendable between one of the pair of front vertical frame supports and one of the pair of rear vertical frame supports. The data center server kit includes a plurality of server cases having a server front panel and a server rear panel, each of the plurality of server cases securable to the pair of front vertical frame supports, an air shroud extending from the server front panel to the server rear panel, a high temperature zone disposed on a first side of the air shroud and a low temperature zone disposed on an opposite side of the air shroud and at least one fan disposed in at least one of the plurality of server cases, the at least one fan for providing air flow. At least one of the plurality of server cases is positionable back to back with an adjacent server case whereby the air flow is maintained from the high temperature zone of the one of the plurality of server cases to the low temperature zone of the adjacent server case and from the low temperature zone of the one of the plurality of server cases to the high temperature zone of the adjacent server case. The data center server kit may include fastening hardware for securing the plurality of support rails to the front and rear vertical frame supports and for securing the server cases to the plurality of support rails. Each of the plurality of support rails may include a stationary bar securable the front and rear vertical frame supports and a slidable bar securable to the server case wherein the server case is slidable from an installed position to a service position. The at least one of the plurality of server cases may include a power supply air shroud for providing a third temperature or for isolating the power supply from the high temperature zone and the low temperature zone or for providing additional cooling for the high temperature zone. The server case may be compatible with full ATX motherboards or micro ATX motherboards.

Another aspect of the present invention is directed to a method for cooling a data center server. The method includes providing a data center server. The data center server includes a data center server frame having two front vertical frame members and two rear vertical frame members, a front opening extending between the two front vertical frame members, a rear opening extending between the two rear vertical frame members and a frame central plane parallel to the front frame opening and the rear frame opening and extending substantially equally between the front frame opening and the rear frame opening, wherein the front frame opening and the rear frame opening are substantially rectangular. The data center server includes a plurality of servers, each server disposed in server cases, the server cases mountable to the data server frame each server case having a front panel and a rear panel, an air shroud extending from the front panel to the rear panel, a high temperature zone disposed on a first side of the air shroud, a low temperature zone disposed on an opposite side of the air shroud and at least one fan disposed in the server case, the at least one fan for providing air flow. The data center server includes a plurality of sliding support rails extending between the two front vertical frame members and the two rear vertical frame members, the plurality of sliding support rails for slidingly securing the plurality of server cases to the data server frame. At least one of the plurality of server cases is positioned back to back with an adjacent server case whereby the air flow is maintained by the at least one fan from the high temperature zone of the one of the plurality of server cases to the low temperature zone of the adjacent server case and from the low temperature zone of the one of the plurality of server cases to the high temperature zone of the adjacent server case. The method includes supplying power to the at least one fan in each of the plurality of server cases and allowing air to flow from the high temperature zone of the one of the plurality of server cases to the low temperature zone of the adjacent server case and from the low temperature zone of the one of the plurality of server cases to the high temperature zone of the adjacent server case.

BRIEF DESCRIPTION OF DRAWINGS

A further understanding of the nature and advantages of particular embodiments may be realized by reference to the remaining portions of the specification and the drawings, in which like reference numerals are used to refer to similar components. When reference is made to a reference numeral without specification to an existing sub-label, it is intended to refer to all such multiple similar components.

DETAILED DESCRIPTION OF THE INVENTION

While various aspects and features of certain embodiments have been summarized above, the following detailed description illustrates a few exemplary embodiments in further detail to enable one skilled in the art to practice such embodiments. The described examples are provided for illustrative purposes and are not intended to limit the scope of the invention.

In the following description, for the purposes of explanation, numerous specific details are set forth in order to provide a thorough understanding of the described embodiments. It will be apparent to one skilled in the art however that other embodiments of the present invention may be practiced without some of these specific details. Several embodiments are described herein, and while various features are ascribed to different embodiments, it should be appreciated that the features described with respect to one embodiment may be incorporated with other embodiments as well. By the same token however, no single feature or features of any described embodiment should be considered essential to every embodiment of the invention, as other embodiments of the invention may omit such features.

In this application the use of the singular includes the plural unless specifically stated otherwise and use of the terms "and" and "or" is equivalent to "and/or," also referred to as "non-exclusive or" unless otherwise indicated. Moreover, the use of the term "including," as well as other forms, such as "includes" and "included," should be considered non-exclusive. Also, terms such as "element" or "component" encompass both elements and components including one unit and elements and components that include more than one unit, unless specifically stated otherwise.

Lastly, the terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps or acts are in some way inherently mutually exclusive.

As this invention is susceptible to embodiments of many different forms, it is intended that the present disclosure be considered as an example of the principles of the invention and not intended to limit the invention to the specific embodiments shown and described.

The terms high-density server, blade server and blade are used interchangeably to mean individual servers or clients that plug into a single cabinet or frame system. A blade is hot swappable.

Figure 1:
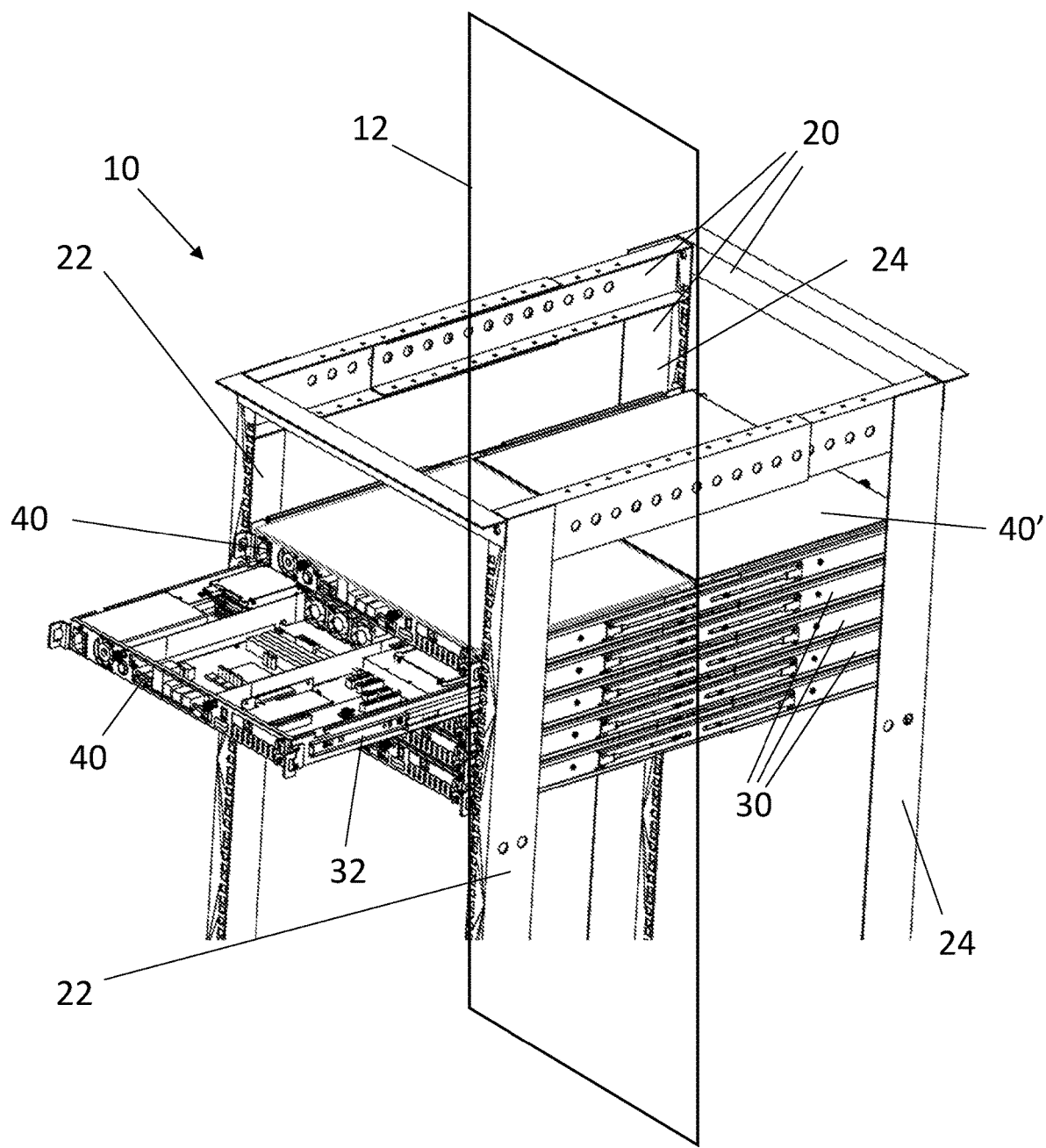
FIG. 1 is a front top right side perspective view of the data center server system according to the present invention.
Figure 2:
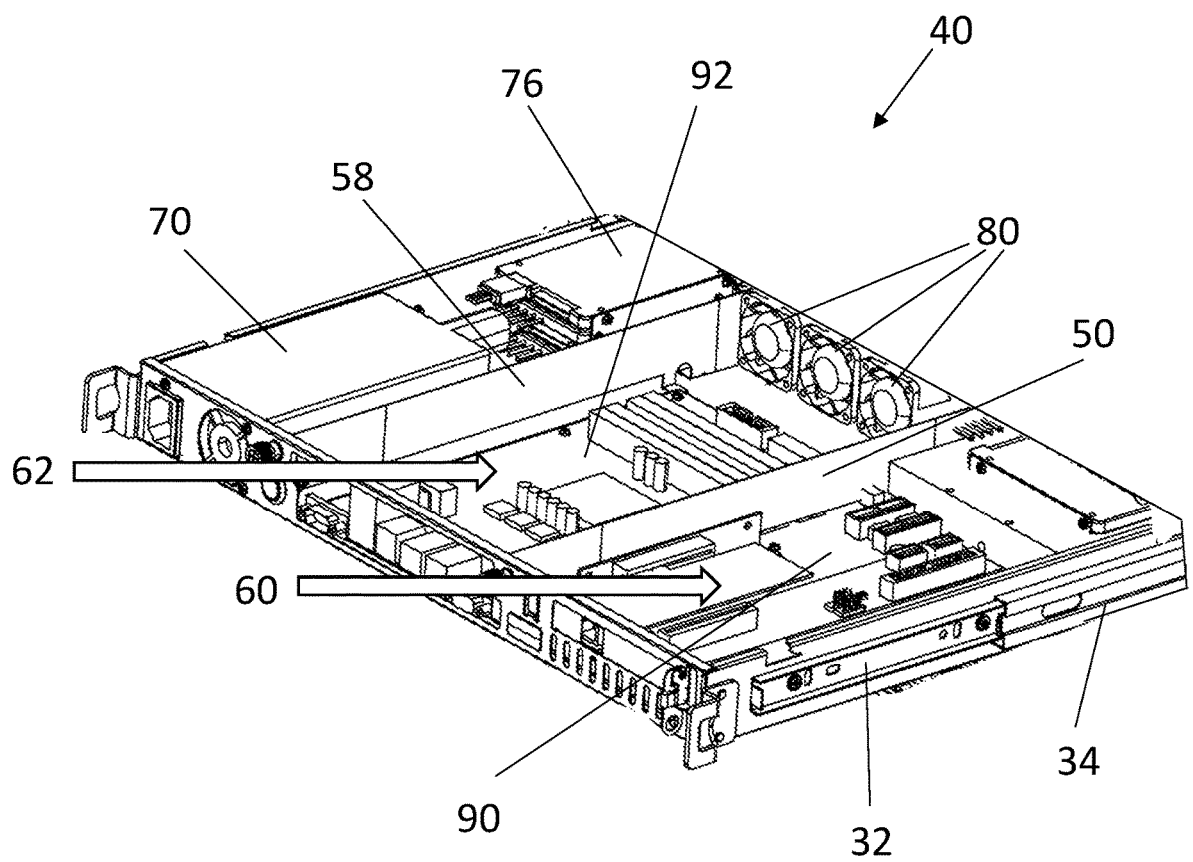
FIG. 2 is a front top right side perspective view of a server case and installed components and sir shrouds according to the present invention.

Referring now to the drawings FIG. 1-4, and more particularly to FIG. 1, there is shown a rackmount server design that allows for back to back units with targeted air flow from the front to the rear unit that separates cold and hot air to prevent heat sensitive server components in the rear from receiving hot air from the front unit.

To increase server density in a data center, two chassis are disposed back-to-back on the server rack. The rack hardware is preferably compatible with most off-the-shelf parts and motherboards micro ATX and full ATX in size. Heat is managed and separated in the front and rear units by flexible air shrouds.

Data center density is doubled and airflow is managed from front to rear units.

The rackmount server frame 20 allows for back to back units with targeted air flow from the front to the rear unit that separates cold and hot air to prevent heat sensitive server components in the rear from receiving hot air from the front unit.

The data center server system 10 includes a data server frame 20 having two front vertical frame members 22 and two rear vertical frame members 24, a front frame opening extending between the two front vertical frame members 22, a rear frame opening extending between the two rear vertical frame members 24 and a frame central plane 12 parallel to the front frame opening and the rear frame opening and extending substantially equally between the front frame opening and the rear frame opening. The front frame opening and the rear frame opening are substantially rectangular. The data center server system 10 includes a plurality of server cases 40 mountable to the data server frame 20 each server case 40 having a front panel and a rear panel, an air shroud 50 extending from the front panel to the rear panel, a high temperature zone 62 disposed on a first side of the air shroud 50, a low temperature zone disposed on an opposite side of the air shroud 50 and at least one fan 80 disposed in each of the plurality of server cases 40, the at least one fan 80 for providing air flow. The data center server system 10 includes a plurality of sliding support rails extending between the two front vertical frame members and the two rear vertical frame members, the plurality of sliding support rails for slidingly securing the plurality of server cases 40 to the data server frame 20. The at least one of the plurality of server cases 40 is positioned back to back with an adjacent server case whereby the air flow is maintained by the at least one fan 80 in the at least one of the plurality of server cases 40 from the low temperature zone 60 of the at least one of the plurality of server cases to the high temperature zone 62 of the adjacent server case 40' or from the high temperature zone 62 of the at least one of the plurality of server cases to the low temperature zone 60 of the adjacent server case 40'. The data center server system 10 may have additional air flow provided by the at least one fan 80 in the adjacent server case 40' from the low temperature zone 60 of the adjacent server case 40' to the high temperature zone 62 of the at least one of the plurality of server cases or from the high temperature zone 62 of the adjacent server case 40' to the low temperature zone 60 of the at least one of the plurality of server cases.

The data center server system 10 may include high-density servers having a plurality of CPUs, each of which may be hot swapped in and out on its own printed circuit board. Each server case may include a power supply air shroud or secondary air shroud 58 for providing a third temperature zone or for isolating a power supply from the high temperature zone 62 and the low temperature zone 60 or for providing additional cooling for the high temperature zone 62. The air shroud 50 may be positioned to prevent heat sensitive server components 92 from receiving hot air from an adjacent server case 40'. In one example, the high heat generating components 90 would share air flow with the low heat generating components 92 of the adjacent server case 40'. The server cases may be compatible with full ATX motherboards or with micro ATX motherboards. Each of the plurality of server cases may be slidable from an installed position wherein the rear panel is adjacent the frame central plane to a servicing position wherein the rear panel is positioned away from the frame central plane. The data server frame 20 may have a cuboid frame, the cuboid frame having a pair of front vertical frame supports and a pair of rear vertical frame supports, at least one left support rail 30 extending between one of the pair of front vertical frame supports and one of the pair of rear vertical frame supports, at least one right support rail 30 extending between another of the pair of front vertical frame supports and the other of the pair of rear vertical frame supports and at least one first server case having a first server front panel and a first server rear panel, the at least one first server case secured to an internal portion of the at least one right support rail 30 and the at least one left support rail.

Figure 4:
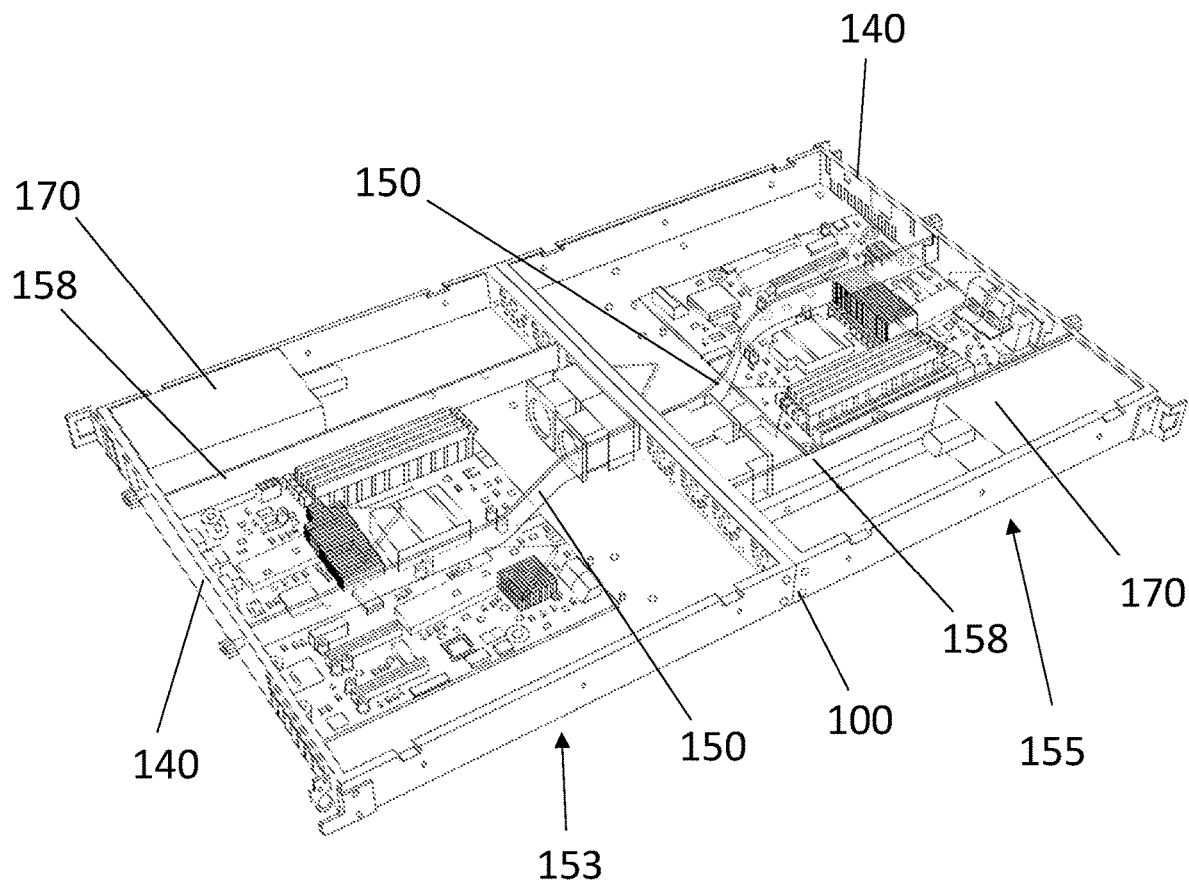
FIG. 4 is a perspective view of back to back servers as they would be installed for a method for cooling a data center server according to the present invention.

FIG. 4 shows another embodiment of the server case 153, 155 that includes two air shrouds which separate three air flow zones. A first server case 153 and an adjacent server case 155 are placeable back to back as shown in FIG. 1. The power supply 170 of the first server case 153 is disposed in a zone isolated by power supply air shroud 158 and has vents directing into the first zone of the adjacent server case 155. The first zone of the adjacent server case 155 is additionally ventable with the first server central zone. The first zone is separated from the central zone by air shroud 150. A front server panel 140 is disposed on each server case 153, 155 opposite the rear panels. The rear panels meet along the central plane 12 (FIG. 1) when the server case 153, 155 are in the inserted position.

Method

Figure 3:
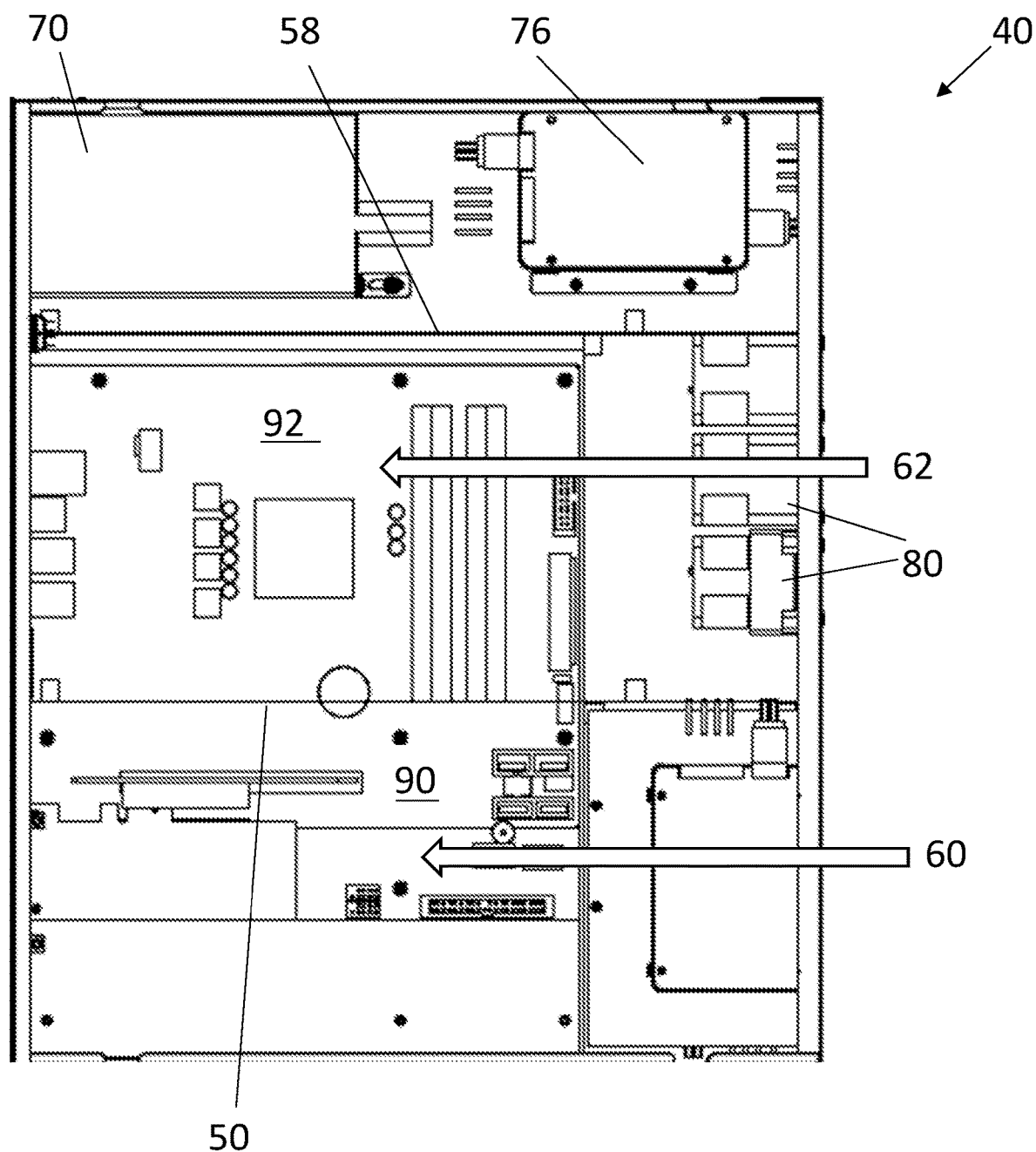
FIG. 3 is a top plan view of a server case and installed components and sir shrouds according to the present invention.

Another aspect of the present invention as shown in FIG. 3 is a method for cooling a data center server. The method includes providing a data center server 10 as shown in FIG. 1. The data center server 10 includes a data center server frame 20 having two front vertical frame members 22 and two rear vertical frame members 24, a front opening extending between the two front vertical frame members, a rear opening extending between the two rear vertical frame members and a frame central plane 12 parallel to the front frame opening and the rear frame opening and extending substantially equally between the front frame opening and the rear frame opening, wherein the front frame opening and the rear frame opening are substantially rectangular. The data center server 10 includes a plurality of servers, each server disposed in server cases, the server cases mountable to the data server frame 20 each server case having a front panel and a rear panel, an air shroud extending from the front panel to the rear panel, a high temperature zone 62 disposed on a first side of the air shroud, a low temperature zone 60 disposed on an opposite side of the air shroud and at least one fan 80 disposed in the server case, the at least one fan 80 for providing air flow. The data center server includes a plurality of sliding support rails extending between the two front vertical frame members and the two rear vertical frame members, the plurality of sliding support rails for slidingly securing the plurality of server cases to the data server frame 20. At least one of the plurality of server cases is positioned back to back with an adjacent server case 40' whereby the air flow is maintained by the at least one fan 80 from the high temperature zone 62 of the one of the plurality of server cases to the low temperature zone 60 of the adjacent server case 40' and from the low temperature zone 60 of the one of the plurality of server cases to the high temperature zone 62 of the adjacent server case 40'. The method includes supplying power to the at least one fan 80 in each of the plurality of server cases and allowing air to flow from the high temperature zone 62 of the one of the plurality of server cases to the low temperature zone 60 of the adjacent server case 40' and from the low temperature zone 60 of the one of the plurality of server cases to the high temperature zone 62 of the adjacent server case 40'

Kit

Another aspect of the present invention is directed to a data center server kit as shown in an assemble form of the kit in FIG. 1. The data center server kit including a data server frame 20 including a pair of front vertical frame supports, a pair of rear vertical frame supports and a plurality of support rails extendable between one of the pair of front vertical frame supports and one of the pair of rear vertical frame supports. The data center server kit includes a plurality of server cases having a server front panel and a server rear panel, each of the plurality of server cases securable to the pair of front vertical frame supports, an air shroud extending from the server front panel to the server rear panel, a high temperature zone 62 disposed on a first side of the air shroud and a low temperature zone 60 disposed on an opposite side of the air shroud and at least one fan 80 disposed in at least one of the plurality of server cases, the at least one fan 80 for providing air flow. At least one of the plurality of server cases is positionable back to back with an adjacent server case 40' whereby the air flow is maintained from the high temperature zone 62 of the one of the plurality of server cases to the low temperature zone 60 of the adjacent server case 40' and from the low temperature zone 60 of the one of the plurality of server cases to the high temperature zone 62 of the adjacent server case 40'. The data center server kit may include fastening hardware for securing the plurality of support rails to the front and rear vertical frame supports and for securing the server cases to the plurality of support rails.

Each of the plurality of support rails may include a stationary bar securable the front and rear vertical frame supports and a slidable bar securable to the server case wherein the server case is slidable from an installed position to a service position. The at least one of the plurality of server cases may include a power supply air shroud for providing a third temperature or for isolating the power supply from the high temperature zone 62 and the low temperature zone 60 or for providing additional cooling for the high temperature zone 62. The server case may be compatible with full ATX motherboards or micro ATX motherboards.

The assembly of all the items into a kit makes the installation simple and easy for the user because the parts necessary to connect the wheels of the instant invention can be assembled to the existing container without using special tools or sealants.

Since many modifications, variations, and changes in detail can be made to the described embodiments of the invention, it is intended that all matters in the foregoing description and shown in the accompanying drawings be interpreted as illustrative and not in a limiting sense. Furthermore, it is understood that any of the features presented in the embodiments may be integrated into any of the other embodiments unless explicitly stated otherwise. The scope of the invention should be determined by the appended claims and their legal equivalents.

In addition, the present invention has been described with reference to embodiments, it should be noted and understood that various modifications and variations can be crafted by those skilled in the art without departing from the scope and spirit of the invention. Accordingly, the foregoing disclosure should be interpreted as illustrative only and is not to be interpreted in a limiting sense. Further it is intended that any other embodiments of the present invention that result from any changes in application or method of use or operation, method of manufacture, shape, size, or materials which are not specified within the detailed written description or illustrations contained herein are considered within the scope of the present invention.

Insofar as the description above and the accompanying drawings disclose any additional subject matter that is not within the scope of the claims below, the inventions are not dedicated to the public and the right to file one or more applications to claim such additional inventions is reserved.

Although very narrow claims are presented herein, it should be recognized that the scope of this invention is much broader than presented by the claim. It is intended that broader claims will be submitted in an application that claims the benefit of priority from this application.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. A data center server system comprising:
   a data server frame having two front vertical frame members and two rear vertical frame members, a front frame opening extending between the two front vertical frame members, a rear frame opening extending between the two rear vertical frame members and a frame central plane parallel to the front frame opening and the rear frame opening and extending substantially equally between the front frame opening and the rear frame opening, wherein the front frame opening and the rear frame opening are substantially rectangular;
   a plurality of server cases mountable to the data server frame each server case having:
      a front panel and a rear panel;
      an air shroud extending from the front panel to the rear panel;
      a high temperature zone disposed on a first side of the air shroud;
      a low temperature zone disposed on an opposite side of the air shroud; and
      at least one fan disposed in each of the plurality of server cases, the at least one fan for providing air flow; and
   a plurality of sliding support rails extending between the two front vertical frame members and the two rear vertical frame members, the plurality of sliding support rails for slidingly securing the plurality of server cases to the data server frame;
   wherein at least one of the plurality of server cases is positioned back to back with an adjacent server case whereby the air flow is maintained by the at least one fan in the at least one of the plurality of server cases from the low temperature zone of the at least one of the plurality of server cases to the high temperature zone of the adjacent server case or from the high temperature zone of the at least one of the plurality of server cases to the low temperature zone of the adjacent server case.

2. The data center server system of claim 1 wherein additional air flow is provided by the at least one fan in the adjacent server case from the low temperature zone of the adjacent server case to the high temperature zone of the at least one of the plurality of server cases or from the high temperature zone of the adjacent server case to the low temperature zone of the at least one of the plurality of server cases.

3. The data center server system of claim 1 wherein the data center server system includes a high-density server having a plurality of CPUs, each of which may be hot swapped in and out on its own printed circuit board.

4. The data center server system of claim 1 wherein each server case includes a power supply air shroud for providing a third temperature or for isolating a power supply from the high temperature zone and the low temperature zone or for providing additional cooling for the high temperature zone.

5. The data center server system of claim 1 wherein the air shroud is positioned to prevent heat sensitive server components from receiving hot air from an adjacent server case.

6. The data center server system of claim 1 wherein at least one of the plurality of server cases is compatible with full ATX motherboards.

7. The data center server system of claim 1 wherein at least one of the plurality of server cases is compatible with micro ATX motherboards.

8. The data center server system of claim 1 wherein each of the plurality of server cases is slidable from an installed position wherein the rear panel is adjacent the frame central plane to a servicing position wherein the rear panel is positioned away from the frame central plane.

9. The data center server system of claim 1 wherein the data server frame has a cuboid frame, the cuboid frame having a pair of front vertical frame supports and a pair of rear vertical frame supports:
at least one left support rail extending between one of the pair of front vertical frame supports and one of the pair of rear vertical frame supports;
at least one right support rail extending between an other of the pair of front vertical frame supports and the other of the pair of rear vertical frame supports; and
at least one first server case having a first server front panel and a first server rear panel, the at least one first server case secured to an internal portion of the at least one right support rail and the at least one left support rail.

10. A data center server kit comprising:
a data server frame including a pair of front vertical frame supports, a pair of rear vertical frame supports and a plurality of support rails extendable between one of the pair of front vertical frame supports and one of the pair of rear vertical frame supports; and
a plurality of server cases having a server front panel and a server rear panel, each of the plurality of server cases securable to the pair of front vertical frame supports, an air shroud extending from the server front panel to the server rear panel, a high temperature zone disposed on a first side of the air shroud and a low temperature zone disposed on an opposite side of the air shroud and at least one fan disposed in at least one of the plurality of server cases, the at least one fan for providing air flow;
wherein at least one of the plurality of server cases is positionable back to back with an adjacent server case whereby the air flow is maintained from the high temperature zone of the one of the plurality of server cases to the low temperature zone of the adjacent server case and from the low temperature zone of the one of the plurality of server cases to the high temperature zone of the adjacent server case.

11. The data center server kit according to claim 10 including fastening hardware for securing the plurality of support rails to the front and rear vertical frame supports and for securing the server cases to the plurality of support rails.

12. The data center server kit according to claim 10 wherein each of the plurality of support rails include a stationary bar securable the front and rear vertical frame supports and a slidable bar securable to the server case wherein the server case is slidable from an installed position to a service position.

13. The data center server kit according to claim 10 wherein the at least one of the plurality of server cases includes a power supply air shroud for providing a third temperature or for isolating the power supply from the high temperature zone and the low temperature zone or for providing additional cooling for the high temperature zone.

14. A method for cooling a data center server, the method comprising:
providing a data center server including:
a data center server frame having two front vertical frame members and two rear vertical frame members, a front opening extending between the two front vertical frame members, a rear opening extending between the two rear vertical frame members and a frame central plane parallel to the front frame opening and the rear frame opening and extending substantially equally between the front frame opening and the rear frame opening, wherein the front frame opening and the rear frame opening are substantially rectangular;
a plurality of servers, each server disposed in server cases, the server cases mountable to the data server frame each server case having:
a front panel and a rear panel;
an air shroud extending from the front panel to the rear panel;
a high temperature zone disposed on a first side of the air shroud;
a low temperature zone disposed on an opposite side of the air shroud; and
at least one fan disposed in the server case, the at least one fan for providing air flow; and
a plurality of sliding support rails extending between the two front vertical frame members and the two rear vertical frame members, the plurality of sliding support rails for slidingly securing the plurality of server cases to the data server frame;
wherein at least one of the plurality of server cases is positioned back to back with an adjacent server case whereby the air flow is maintained by the at least one fan from the high temperature zone of the one of the plurality of server cases to the low temperature zone of the adjacent server case and from the low temperature zone of the one of the plurality of server cases to the high temperature zone of the adjacent server case;
supplying power to the at least one fan in each of the plurality of server cases; and
allowing air to flow from the high temperature zone of the one of the plurality of server cases to the low temperature zone of the adjacent server case and from the low temperature zone of the one of the plurality of server cases to the high temperature zone of the adjacent server case.

15. The method for cooling a data center server of claim 14 wherein the data center server includes a high-density server having a plurality of CPUs, each of which may be hot swapped in and out on its own printed circuit board.

16. The method for cooling a data center server of claim 14 wherein each server case includes a power supply air shroud for providing a third temperature or for isolating the power supply from the high temperature zone and the low temperature zone or for providing additional cooling for the high temperature zone.

17. The method for cooling a data center server of claim 14 wherein the air shroud is positioned to prevent heat sensitive server components from receiving hot air from an adjacent server case.

18. The method for cooling a data center server of claim 14 wherein the server case is compatible with full ATX motherboards.

19. The method for cooling a data center server of claim 14 wherein the server case is compatible with micro ATX motherboards.

20. The method for cooling a data center server of claim 14 wherein each of the plurality of server cases is slidable from an installed position wherein the rear panel is adjacent the frame central plane to a servicing position wherein the rear panel is positioned away from the frame central plane.

* * * * *